United States Patent
Ayres et al.

(10) Patent No.: US 6,330,160 B1
(45) Date of Patent: Dec. 11, 2001

(54) COMPONENT RETENTION CLIP FOR A HEAT SINK ASSEMBLY

(75) Inventors: John W. Ayres; Susan M. Ayres, both of Forney; Vincent M. Byrne, Mesquite; Edward C. Fontana, Rockwall, all of TX (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/625,679

(22) Filed: Jul. 25, 2000

(51) Int. Cl.$^7$ ....................................................... H05K 7/20
(52) U.S. Cl. ............................... 361/707; 24/457; 29/832; 257/726; 248/510; 361/719
(58) Field of Search ............................... 24/453, 457, 458, 24/473, 625; 267/150, 158, 160; 174/16.3; 165/80.3, 185; 248/316.7, 505, 510; 257/706, 707, 718, 719, 726, 727; 361/703, 704, 707, 722, 709–711, 717–719, 720; 29/832, 854, 890.032, 890.035

(56) References Cited

U.S. PATENT DOCUMENTS 4,203,488 * 5/1980 Johnson et al. ...................... 165/80.3
4,235,285 * 11/1980 Johnson et al. ...................... 165/80.3
4,544,942 * 10/1985 McCarthy .............................. 257/721
5,485,671 * 1/1996 Larson .
6,075,703 * 6/2000 Lee ........................................ 361/707
6,128,191 * 10/2000 Bell et al. ............................. 361/720
6,201,699 * 3/2001 Ayres .

* cited by examiner

*Primary Examiner*—Gerald Tolin

(57) ABSTRACT

The present invention is directed to a mounting clip for electronic components and, more specifically, to a component retention spring clip for securing electronic components to an electronic device support such as the leg of a heat sink. In one embodiment the component retention clip is comprised of a resilient strip that has an arcuate portion and first and second ends. The resilient strip is configured to encompass an electronic component and an electronic device support adjacent to the electronic component. The arcuate portion of the component retention clip contacts a portion of the electronic component, thereby partially supporting the electronic component against the electronic device support. Located at the first end of the resilient strip is a first latch configured to cooperatively engage a corresponding second latch located at the second end and retain the electronic component on the electronic device support.

12 Claims, 4 Drawing Sheets

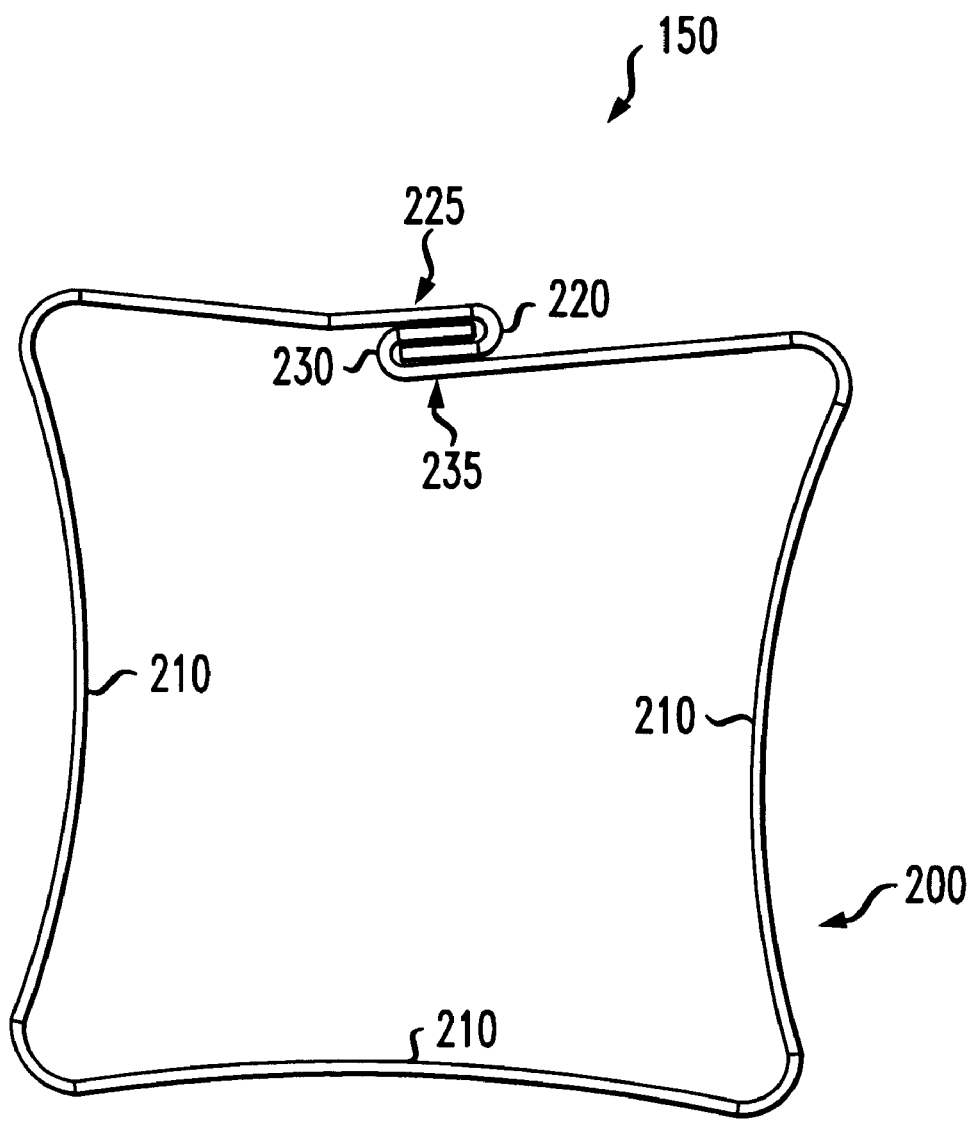

COMPONENT RETENTION CLIP FOR A HEAT SINK ASSEMBLY

TECHNICAL FIELD OF THE INVENTION

The present invention is directed, in general, to a mounting clip for electronic components and, more specifically, to a component retention spring clip for securing electronic components to a heat sink assembly.

BACKGROUND OF THE INVENTION

Electronic components often generate operating temperatures that can cause component damage and circuit failure if temperature control methods are not employed. The generally preferred temperature control method is to use a heat sink to transfer heat from the heat generating components to the ambient air surrounding the associated electronic assembly. A heat sink can be made of any material with favorable heat transfer characteristics, such as copper, aluminum or steel, although aluminum is generally preferred for cost and weight reasons.

In most cases a heat generating component is placed in direct contact with a heat sink in order to provide for the most efficient transfer of heat from the component to the heat sink. After the heat sink absorbs heat from the component, the heat dissipates throughout the heat sink structure and transfers by conduction or convection to the surrounding ambient air.

A typical electronic circuit will have a number of heat generating components or devices fastened to heat sinks. This usually means that the printed wiring or circuit board on which the heat generating components are mounted must be able to accommodate a number of heat sinks. This also means that factors other than temperature control must be taken into consideration when designing a board mounted electronic assembly. For example, the amount of real estate on the board required by heat sinks must be considered in designing the board layout as well as the volume of the space available in the enclosure housing the electronic circuit. In many such cases the real estate on the board and enclosure space occupied by heat sinks will constitute a significant percentage of the total board space and enclosure volume available. This means that circuit designers must address heat dissipation problems from a space and weight viewpoint in order to produce the highly valued small electronics system that customers prefer.

Some of the space and volume concerns related to heat control have been addressed by designing new board arrangements for heat sinks. In order to permit such new arrangements to be used, new heat sink designs have also been developed to provide better thermal performance in less space.

Designing heat sinks and arranging them to provide for more efficient thermal performance in a smaller space has, in some instances, created its own set of problems. One such problem is that the amount of working space on the printed circuit or wiring board has been reduced, making it more difficult to assemble the circuit. Another problem is that the mounting surfaces on the heat sink to which the heat generating components are fastened are not as accessible as they were on prior art heat sinks. Prior art threaded fastener secured clamps can sometimes be very difficult to use in fastening electronic components to the heat sinks. In some cases, the most advantageous heat sink geometry does not provide paths for tools to reach screws and other fasteners, thereby preventing this advantageous heat sink geometry from being used with prior art clamps. These prior art devices often require significant time and effort to attach an electrical component, which, of course, adds manufacturing cost and hampers production efficiency. Prior art spring clip designs do not address the problem of mounting components on the opposing sides of a heat sink leg.

Accordingly, what is needed in the art is a device that can be used to secure heat generating components to a heat sink where access to the mounting surface on the heat sink is limited because of design considerations.

SUMMARY OF THE INVENTION

To address the above-discussed deficiencies of the prior art, the present invention provides a mounting clip for electronic components and, more specifically, to a component retention spring clip for securing electronic components to an electronic device support, such as the leg of a heat sink. In one embodiment the component retention clip is comprised of a resilient strip that has an arcuate portion and first and second ends. The resilient strip is configured to encompass an electronic component and an electronic device support adjacent to the electronic component. The arcuate portion of the component retention clip is configured to contact a portion of the electronic component, thereby partially supporting the electronic component against the electronic device support. Located at the first end of the resilient strip is a first latch configured to cooperatively engage a corresponding second latch located at the second end and retain the electronic component on the electronic device support.

The present invention in one aspect, therefore, introduces a clip or fastener to mount an electronic component on a support, such as the leg of a heat sink. The invention is particularly useful for mounting an electronic component to a heat sink where the heat sink design provides only a limited amount of access space to the electronic component after it is placed in position for mounting. In some such cases the access space is so limited that it is impossible to use prior art devices to secure components to a heat sink. The present invention overcomes this deficiency found in prior art fasteners.

In one embodiment, the resilient strip is a metallic alloy. It is particularly advantageous to use iron based alloys in this embodiment of the invention because such alloys have a superior resiliency. In another embodiment of the invention, the resilient strip is configured to encompass a plurality of electronic components. Another aspect provides for the resilient strip to be comprised of a plurality of arcuate portions. A resilient strip with a plurality of arcuate portions increases the total supporting structure of the clip and provide additional support to the component or components. This embodiment will be explained in detail herein.

In still another embodiment of the invention the component retention clip has the first and the second latches formed from the resilient strip. One aspect of this embodiment provides for the first and second latches to be formed as hooks. This embodiment permits the clip to be secured by taking advantage of the resiliency of the strip to keep the hooks together after they have been cooperatively engaged with one another.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIGS. 2A and 2B illustrate an open and a closed view of an embodiment of a component retention clip constructed in accordance with the present invention.

DETAILED DESCRIPTION

Figure 1:
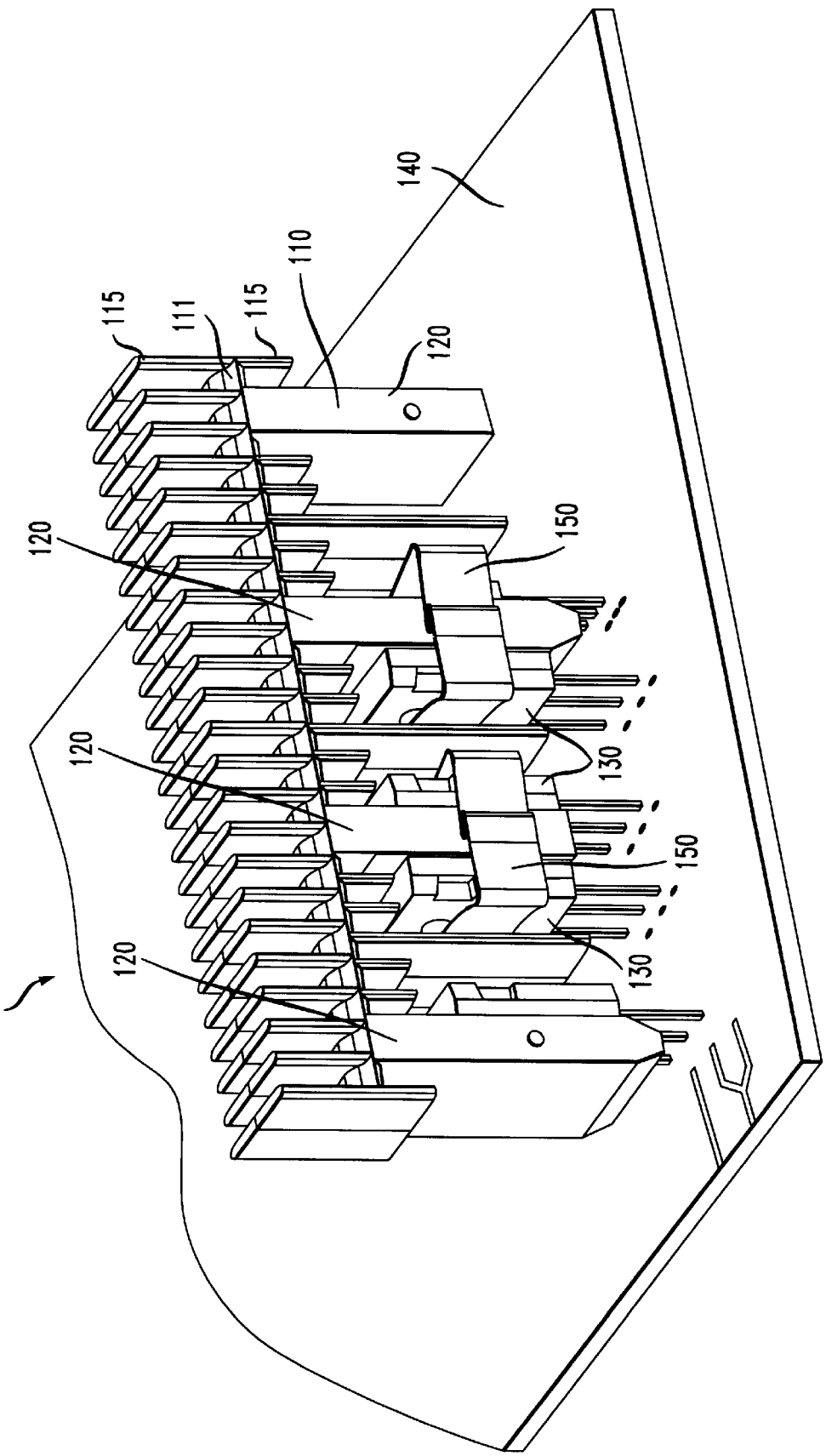
FIG. 1 illustrates an embodiment of an electronics assembly constructed in accordance with the present invention with electronic components coupled to electronic device support legs on a heat sink by a component retention clip.

Referring initially to FIG. 1, illustrated is an embodiment of an electronics assembly 100 constructed in accordance with the present invention that has electronic components 130 coupled to a heat sink's 110 electronic device support legs 120 by a component retention clip 150. The heat sink 110 is positioned to be coupled to a printed wiring board 140.

The heat sink 110 has a longitudinal spine 111 with cooling fins 115 extending from each side. The heat sink 110 also has electronic device support legs 120 extending from the spine 111. In the illustrated embodiment, the support legs 120 are configured to support a plurality of electronic components 130 by providing a mounting surface on each side of each leg 120. Two of the support legs 120 are used to attach or mount the heat sink 110 to the printed circuit or wiring board 140.

By mounting the heat generating components 130 directly to the heat sink 110, component 130 heat is absorbed directly and dispersed throughout the heat sink's 110 structure, including its cooling fins 115. The cooling fins 115 then transfer the heat into the surrounding air by conduction or convection. When a cooling fan is used to facilitate cooling by moving air across the heat sink 110, the direction of air flow parallels the surface of the cooling fins 115 and is transverse to the spine 111 of the heat sink 110. The illustrated heat sink 110 embodiment is described in detail in U.S. Patent application Ser. No. 09/259,772, entitled TRANSVERSE MOUNTABLE HEAT SINK FOR USE IN AN ELECTRONIC DEVICE, Ayres, John W., et. al., now U.S. Pat. No. 6,201,699, commonly assigned with the invention and incorporated herein by this reference.

The configuration of the heat sink's 110 electronic device support legs 120 provides very limited space to access an electronic component 130 after it is positioned for mounting. This limited space makes it difficult to use conventional prior art spring clips, screws, bolts and other conventional fasteners to couple electronic components 130 to the legs 120. It is preferable, therefore, to use some form of clamping device to secure components 130 to the legs 120. As will be explained herein, the illustrated component retention clip 150 is particularly well suited for securing electronic components 130 to the illustrated heat sink's 110 electronic device support legs 120.

Figure 2A:
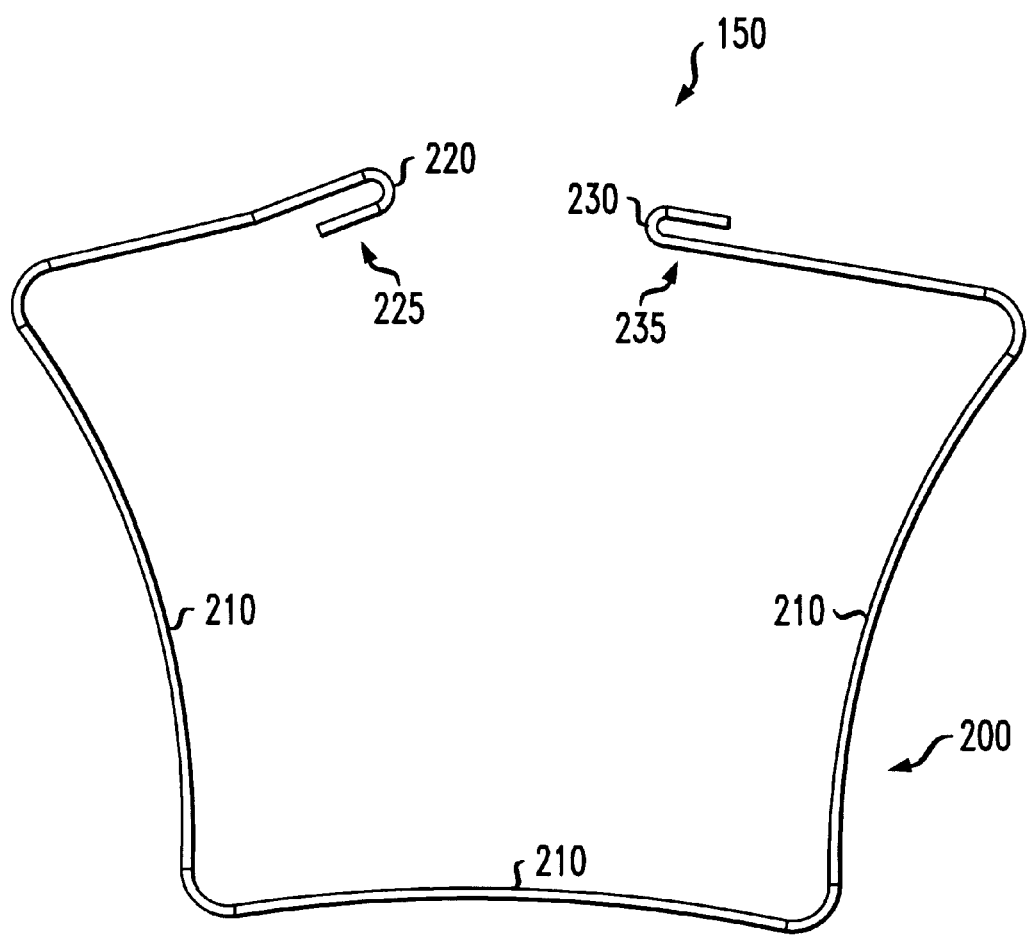

Turning now to FIGS. 2A and 2B, illustrated is an open and closed view, respectively, of an embodiment of a component retention clip 150 constructed in accordance with the present invention. The clip 150 is a resilient strip 200 that has arcuate portions 210 and a first 220 and a second 230 end. In one embodiment of the invention the resilient strip 200 is a metallic alloy. It is particularly advantageous to use iron based alloys because of the superior resiliency of such alloys. Located at the first end 220 of the resilient strip 200 is a first latch 225 configured to cooperatively engage a corresponding second latch 235 located at the second end 230. In the illustrated embodiment of the invention, the component retention clip 150 has first 225 and second 235 latches formed from the resilient strip 200. These latches 225, 235 are formed as hooks. FIG. 2B illustrates the beneficial aspect of this embodiment, which permits the clip 150 to be secured by taking advantage of the resiliency of the strip to keep the hooks 225, 235 fastened together after they have been cooperatively engaged with one another.

It will be apparent to those skilled in the pertinent art that any type of latch 225, 235 located on the first 220 and second 230 ends of the strip 200 is within the intended scope of the present invention. It is also apparent to those skilled in the pertinent art that the clip 150 can be used to attach electronic components 130 to configurations of electronic device supports other than the illustrated heat sink's 110 electronic device support legs 120.

Figure 3:
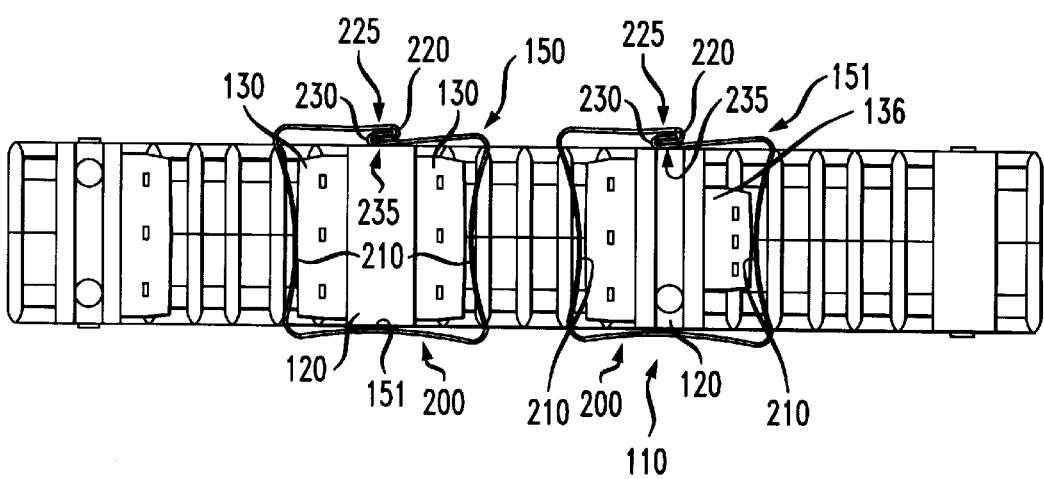
FIG. 3 illustrates a bottom view of the electronics assembly illustrated in FIG. 1 with component retention clips coupling electronic components to electronic device support legs.

Turning now to FIG. 3, illustrated is a bottom view of the heat sink 110 illustrated in FIG. 1 showing an embodiment of a component retention clip 150, constructed in accordance with the present invention, coupling electronic components 130 to the heat sink's 110 electronic device support legs 120. This bottom view will be used to explain how the illustrated clip 150 works.

The resilient strip 200 is configured to encompass the electronic components 130 and the electronic device support legs 120 to which the components 130 are coupled. An arcuate portion 210 of the strip 200 contacts a portion of the component 130 and presses the component 130 against the electronic device support leg 120, thereby partially supporting the component 130 against the support leg 120. The resilient strip 200 is secured about the components 130 and the support leg 120 by the first latch 225 cooperatively engaging the corresponding second latch 235.

In the illustrated embodiment the arcuate portions 210 of the strip 200 flexes to provide elastic displacement so that the two latches 225, 235 can be engaged by pinching the ends 220, 230 of the strip 200 together and releasing them. This is particularly beneficial from a manufacturing viewpoint because the clip 200 can be left in a relaxed state while the components 230 are being arranged. After the components are in place the clip 150 can be fastened and the components 130 will be secured against the support leg 120.

In the embodiment illustrated in FIGS. 1 and 3, the resilient strip 200 is configured to encompass a plurality of electronic components 130. This is useful because it permits, in the illustrated heat sink embodiment, at least two electronic components 130 to be coupled to a single support leg 120. Another particularly beneficial embodiment of the invention provides for a plurality of arcuate portions 210 in the resilient strip 200. This permits a separate arcuate portion 210 of the strip 200 to be used to support each separate components 130 against the electronic device support leg 120.

Another beneficial aspect of the embodiment of the invention that provides for a plurality of arcuate portions 210 in the strip 200, is that at least one arcuate portion 210 can be used to support the strip 200 against an edge 151 of the support leg 120. This provides additional support to the assembly 100 and strengthens the entire structure of support leg 120, electronic components 130 and clip 150.

Referring again to FIG. 3, one of the clips 151 is illustrated supporting a small electronic component 136 against one side of the electronic device support leg 120 and a larger component 135 on the other side. This particularly advantageous feature of the invention permits electronic components 135, 136 of different sizes to be supported against an electronic device support leg 120 by a single clip 151.

Although the embodiments illustrated in FIGS. 1 and 3 show a strip 200 with a plurality of arcuate portions 210, those skilled in the pertinent art will understand that a single arcuate portion in the strip is within the intended scope of the present invention. Similarly, those skilled in the pertinent art will understand that a strip 200 that encompasses a single electronic component 130 and a support leg 120 is within the intended scope of the present invention.

The invention includes several embodiments of methods of manufacturing a component retention clip and an electronics assembly. Sufficient detail has been set forth herein to enable one of ordinary skill in the pertinent art to understand and practice the various embodiments of such methods Although the present invention has been described in detail, those skilled in the art should understand that they can make various changes, substitutions and alterations herein without departing from the spirit and scope of the invention in its broadest form.

What is claimed is:

1. An electronics assembly, comprising:
    a printed wiring board having a heat sink coupled thereto, said heat sink having a plurality of cooling fins and an electronic device support leg;
    an electronic component couplable to said electronic device support leg; and
    a component retention clip securing said electronic component to said electronic device support, said component retention clip, including:
        a resilient strip having an arcuate portion having a concaved configuration and first and second sides joined by said arcuate portion and extending from said arcuate portion in a same direction as said concaved configuration and each of the first and second sides having a length sufficient to encompass an electronic component and an electronic device support leg adjacent said electronic component, thereby to support said electronic component against said electronic device support; and
        a first latch located on an end of said first side and a corresponding second latch located at said second end, said first and second latches cooperatively engageable with each other to retain said resilient strip in a latched configuration.

2. The electronics assembly as recited in claim 1 wherein said resilient strip is a metallic alloy.

3. The electronics assembly as recited in claim 1 wherein said resilient strip is configured to encompass a plurality of electronic components.

4. The electronics assembly as recited in claim 1 wherein said resilient strip further comprises a plurality of arcuate portions.

5. The electronics assembly as recited in claim 1 wherein said first and said second latches are formed from said resilient strip.

6. The electronics assembly as recited in claim 5 wherein said first and second latches are hooks.

7. A method of manufacturing an electronics assembly, comprising:
    providing a printed wiring board having a heat sink coupled thereto, said heat sink having a plurality of cooling fins and an electronic device support leg;
    providing an electronic component couplable to said electronic device support leg; and
    securing said electronic component to said electronic device support leg with a component retention clip, said component retention clip, including:
        a resilient strip having an arcuate portion having a concaved configuration and first and second sides joined by said arcuate portion and extending from said arcuate portion in a same direction as said concaved configuration and each of the first and second sides having a length sufficient to encompass an electronic component and an electronic device support leg adjacent said electronic component, thereby to support said electronic component against said electronic device support; and
        a first latch located on an end of said first side and a corresponding second latch located at said second end, said first and second latches cooperatively engageable with each other to retain said resilient strip in a latched configuration.

8. The method of manufacturing an electronics assembly as recited in claim 7 wherein said resilient strip is a metallic alloy.

9. The method of manufacturing an electronics assembly as recited in claim 7 wherein said resilient strip is configured to encompass a plurality of electronic components.

10. The method of manufacturing an electronics assembly as recited in claim 7 wherein said resilient strip further comprises a plurality of arcuate portions.

11. The method of manufacturing an electronics assembly as recited in claim 7 wherein said first and said second latches are formed from said resilient strip.

12. The method of manufacturing an electronics assembly as recited in claim 11 wherein said first and second latches are hooks.

* * * * *